United States Patent [19]

Smith et al.

[11] E Re. 31,526

[45] Reissued Feb. 28, 1984

[54] COATED CEMENTED CARBIDE BODY AND METHOD OF MAKING SUCH A BODY

[75] Inventors: Ulf K. H. Smith, Huddinge; Jan N. Lindstrom, Norsborg, both of Sweden; Harold Mantle, Hauterive, Switzerland

[73] Assignee: Santrade Ltd., Lucerne, Switzerland

[21] Appl. No.: 331,314

[22] Filed: Dec. 16, 1981

Related U.S. Patent Documents

Reissue of:

[64] Patent No.: 4,180,400
Issued: Dec. 25, 1979
Appl. No.: 913,035
Filed: Jun. 6, 1978

[30] Foreign Application Priority Data

Jun. 9, 1977 [SE] Sweden ..... 7706706

[51] Int. Cl.[3] ..... B22F 5/00

[52] U.S. Cl. ..... 75/235; 427/253; 427/255; 427/255.2; 428/546; 428/469; 419/5; 419/6; 419/8; 419/16

[58] Field of Search ..... 75/203, 204

[56] References Cited

U.S. PATENT DOCUMENTS 3,967,035 6/1976 Hale ..... 428/469
3,999,954 12/1976 Kolaska et al. ..... 75/208 R
4,018,631 4/1977 Hale ..... 428/469
4,052,530 10/1977 Fonzi ..... 428/469

*Primary Examiner*—Brooks H. Hunt
*Attorney, Agent, or Firm*—Burns, Doane, Swecker and Mathis

[57] ABSTRACT

An improved sintered cemented carbide body and method for making same is disclosed. The improved sintered cemented carbide body contains at least one metal carbide and a binder metal, on which body there is applied at least one thin, wear resistant surface layer consisting essentially of aluminum oxide and is characterized in that at least 85% of the aluminum oxide consists of the kappa form, the remainder, which mainly constitutes the alpha form, being formed as surface portions or spots having a size of at the most 10 μm, [the size and the occurrence of the surface portions being so adjusted that they lie within the area AOB in FIG. 1 of the attached drawing.]

The body is made by a method wherein a cemented carbide substrate is contacted with a gas containing an aluminum halide and a reducing agent at high temperature, characterized in that a dopant addition of tetravalent titanium, zirconium and/or hafnium ions is added to the gas in an amount of 0.03–0.5% of the totally supplied amount of gas.

28 Claims, 2 Drawing Figures

Fig. 1
(Amended By Reissue)
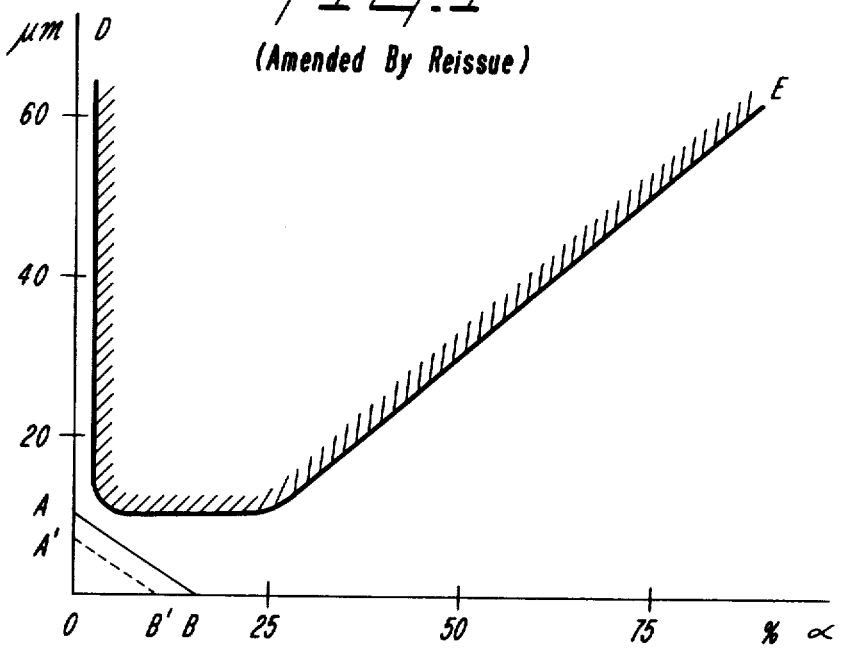
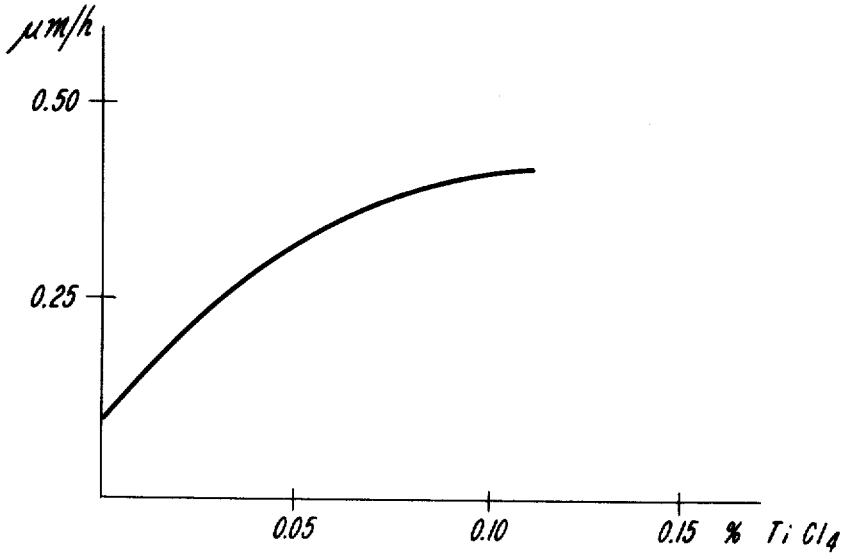
Fig. 2

COATED CEMENTED CARBIDE BODY AND METHOD OF MAKING SUCH A BODY

Matter enclosed in heavy brackets [ ] appears in the original patent but forms no part of this reissue specification; matter printed in italics indicates the additions made by reissue.

BACKGROUND OF THE INVENTION

The present invention relates to sintered cemented carbide bodies coated with thin and extremely wear resistant surface layers. The invention also relates to a method of making such coated bodies.

It is known that the wear resistance of pressed and sintered cemented carbide bodies, as for example, inserts for chipforming machining, can be increased considerably by applying hard surface layers. In particular, coatings of metal carbides, metal nitrides or metal oxides have been applied as thin layers (having, for example, a thickness between 1 to 20 μm) on the cemented carbide core or the substrate. It is also known that further advantages can be reached in certain cases by using a thin coating composed of two or several different layers applied on top of each other, for example, the use of a carbide or a nitride as an intermediate layer below an outer ceramic layer. Aluminum oxide ($Al_2O_3$) and zirconium oxide ($ZrO_2$) are examples of such ceramic surface layers. One main method of applying the surface coatings is the CVD-technique "Chemical Vapor Deposition", in which the coating is deposited on a hot substrate by reaction between gaseous components. For the production of aluminum oxide coatings, the most common chemical vapor deposition system which has been employed utilizes the hydrogen reduction of aluminum chloride, which is either evaporated directly, or formed by the reaction between aluminum metal and chlorine or hydrogen chloride, and the reaction with water vapor, which is either evaporated directly or formed by the reaction between hydrogen and carbon dioxide, or oxygen.

Suitable hard, polycrystalline, compact and well-adherent coatings of aluminum oxide possessing the desired wear-resistant properties are normally only obtained at deposition temperatures above about 950° C. At lower deposition temperatures, loose, powdery deposits are usually obtained which deposits consist of the gamma and/or theta modifications of aluminum oxide. At deposition temperatures of about 1000° C. and above, the aluminum oxide phase which has normally been identified and found suitable for cutting tools is the alpha form of modification. This form of aluminum oxide is, however, a high temperature phase which is normally not expected to be produced in a pure state by chemical vapor deposition at a deposition temperature below 1000° C. The stability of alpha aluminum oxide deposited at temperatures below 1000° C. is dependent upon the presence of impurities or dopants either coming from the substrate which is being coated or from the gas phase. When using pure alpha aluminum oxide substrates, epitaxial growth of alpha aluminum oxide by chemical vapor deposition only takes place at deposition temperatures above about 1500° C.

From the above, it is clear that there is a considerable risk of obtaining multiphase aluminum oxide coatings at the temperatures normally used in the production of coated tools. In a multiphase coating, the boundary regions between the various phases will constitute regions of considerable mechanical weakness and they can therefore be the cause of premature tool failures.

The deposition of an aluminum oxide coating involves the diffusion of various species from the substrate and/or the gas phase. The interplay of the various diffusion, nucleation and growth mechanisms which govern the formation of the coating is very delicate and can easily result in the formation of inhomogeneous deposits. Since such mechanisms are often difficult to control, a process which can provide a stable, specific aluminum oxide phase would be most advantageous as cemented carbide bodies having a single-phase aluminum oxide coating are expected to have a superior and more consistent performance when compared to multiphase aluminum oxide coatings.

SUMMARY OF THE INVENTION

In accordance with one aspect of the present invention, there is provided a sintered cemented carbide body containing at least one metal carbide and a binder metal, on which body there is applied at least one thin, wear resistant surface layer consisting essentially of aluminum oxide, characterized in that at least 85% of the aluminum oxide consists of the kappa form, the remainder, which mainly constitutes the alpha form, being formed as surface portions or spots having a size of at the most 10 μm, the size and the occurrence of the surface portions being so adjusted that they lie within the area AOB in FIG. 1 of the attached drawing.

In accordance with another aspect of the present invention, there is provided a method of making an aluminum-oxide coated cemented carbide body wherein a cemented carbide substrate is contacted with a gas containing an aluminum halide and a reducing agent at high temperature, characterized in that a dopant addition of tetravalent titanium, zirconium and/or hafnium ions is added to the gas in an amount of 0.03–0.5% of the totally supplied amount of gas whereby the cemented carbide substrate is coated with aluminum oxide, at least 85% of which is in the kappa form.

According to the present invention, it has now been found possible to produce a cemented carbide body provided with an aluminum oxide coating consisting of a very interesting phase with respect to chip-forming machining. The aluminum oxide, being essentially monophase, consists of the kappa form or modification and its preparation has been performed according to certain defined steps. The layer can be applied on coated as well as non-coated cemented carbide substrates and can also be used as surface or intermediate layers in multi-layer coatings of the most varying kinds. Preferably, the coating is applied on an intermediate layer of a wear resistant carbide, nitride, carbonitride and/or boride. In particular, these carbides, carbonitrides, nitrides and borides are formed with one of the elements Ti, Zr, Hf, V, Nb, Ta, Cr, Mo, W, Si and B (with exception of boride formed with the element B). Carbide, nitride and/or carbonitride of titanium are particularly suited as intermediate layers.

DESCRIPTION OF THE DRAWINGS

FIG. 1 is a graph of the relationship between spot size and area coverage for alpha aluminum oxide spots in aluminum-oxide coatings deposited on titanium-carbide coated cemented-carbide substrates by means of chemical vapor deposition.

FIG. 2 is a graph of the effect of addition of titanium tetrachloride during chemical vapor deposition of aluminum oxide on titanium-carbide coated cemented-carbide substrates.

DETAILED DESCRIPTION OF THE PREFERRED EMBODIMENTS

The preparation of the coating or of the cemented carbide body according to the invention can be done by doping the aluminum oxide coating with a specific and controlled amount of essentially tetravalent titanium and/or zirconium and/or hafnium ions during the deposition process so that essentially all (85% or more) kappa aluminum oxide is formed.

The titanium and/or zirconium and/or hafnium dopant can be incorporated in the aluminum oxide coating by means of the addition of a titanium, zirconium or hafnium halide, preferably titanium tetrachloride, to the normal gas mixture used for the deposition of aluminum oxide. Addition of titanium halide to the mentioned normal gas mixture for the co-deposition of aluminum oxide and titanium oxide has previously been used to make composite alpha aluminum oxide/titanium sesquioxide ($Ti_2O_3$) coatings. However, the present invention concerns the exact determination of the quantity of halide to be added to the deposition gas mixture so that titanium and/or zirconium and/or hafnium ions can be incorporated in the aluminum oxide in such a manner as to lead to (when compared to conventional aluminum oxide coated grades of metal carbides) a most unexpected formation of aluminum oxide which is essentially only in the kappa phase. When titanium and/or zirconium and/or hafnium is present in the reactor milieu in the proper concentration and valence state (+4) part or all will be incorporated in the coating and cause the kappa modification to form. (The explanation is theoretically complex and not yet understood, but it can be mentioned that in the earlier mentioned, known processes the titanium was probably added as trivalent ions, leading to the formation of conventional α-aluminum oxide).

Of particular importance in the present invention are also the starting conditions of the aluminum oxide deposition process which determine the oxidation state of the surface of the substrate or the intermediate layer. In the case of an intermediate layer of, e.g., titanium carbide, it has been discovered that oxidizing conditions before the start of the aluminum oxide deposition process will not provide the kappa phase of aluminum oxide but instead the alpha phase of aluminum oxide.

Pre-oxidation of an intermediate titanium carbide layer before coating with aluminum oxide has already been proposed in literature. The titanium oxide thus obtained can either be more or less dissolved by the underlying titanium carbide layer and form an oxycarbide, or by the aluminum oxide layer and form a mixed oxide. In the case of oxygen migration into the titanium carbide layer the oxycarbide forms because of the considerable range of nonstoichiometry of titanium carbide and the mutual solubility of titanium oxide and titanium carbide.

Most surprisingly, it has been found that a coating of kappa aluminum oxide is superior to one of the alpha modification although the latter is more dense (3.99 $kg/dm^3$ compared to 3.25 $kg/dm^3$ for the kappa phase). Although the reason for this superiority is not understood, it is possibly due to the finer grain-size of the kappa phase which has been observed or to improved bonding occurring between the kappa aluminum oxide layer and the substrate, e.g., a titanium carbide layer. Improved bonding is expected for the reason that when kappa aluminum oxide is obtained by means of the present invention, no excessive amounts of titanium oxide will be present on or in top region of the titanium carbide layer. Formation of titanium oxide involves a volume expansion relative to the underlying titanium carbide and this can have detrimental effects on the adhesion in surface region of the titanium carbide.

In commercially available, doubly coated (aluminum oxide-titanium carbide), cemented carbide grades, significant amounts of kappa aluminum oxide are also formed, and in fact, 2–98% of the surface might consist of kappa aluminum oxide and the remainder of alpha aluminum oxide. The scatter in the amount of kappa aluminum oxide can thus be considerable in this case. Furthermore, the size of the circular areas of alpha aluminum oxide is quite large, 10–200 μm. When large parts of the surface consist of alpha phase, the circular spots often merge together leaving irregularly shaped areas of kappa aluminum oxide. Large, overlapping areas of alpha aluminum oxide are undesirable since they may easily break off and be carried away by the chip or the workpiece if they happen to be located in the critical regions of the tool edge.

By means of the invention, it has now been found possible to reduce the amount of alpha aluminum oxide to less than 15% and preferably less than 10% in a consistent manner and also to reduce the size of the remaining alpha phase spots to less than about 10 μm, preferably less than 6 μm.

The relationship between the size and the amount or area of the alpha phase spots has been illustrated in FIG. 1. In earlier known aluminum oxide coatings there can be found, as noted before, relatively large α-phase spots and great variations concerning the size of the α-phase spots, as well as the amount of α-phase. The lower limit of this area is marked by the curve D-E in the diagram. According to the invention, it has now been found possible to obtain greatly improved properties if the size and occurrence of the α-phase spots [are so adjusted that they] fall within the area AOB [and] preferably within the area A'OB' in FIG. 1.

A further advantage of the present invention is the enhanced rate of deposition which leads to drastically shortened production times. Depending on the amounts of halide added, growth rates exceeding those obtained without a halide dopant by a factor of two or more are obtained. Apart from an increase in the production rate of coatings as such, the increase in growth rate is of direct benefit to the quality of the coating in that it reduces the period of time during which the coating is at high temperatures, as a result of which the likelihood of unwanted changes in the coating structure due to exposure to the high temperature will be considerably reduced.

The aluminum oxide layer may be deposited by any conventional method, preferably by chemical vapor deposition with the addition of a titanium and/or zirconium and/or hafnium dopant. This mode of deposition is applicable also when the cemented carbide substrate is coated with an intermediate layer or if several successive layers are applied or formed before or after the actual aluminum oxide layer. The chemical vapor deposition of the kappa aluminum oxide coating may be made separately to the deposition of the intermediate layer (or other possible surface layers), but should preferably be made consecutively in the same apparatus so that control may be achieved over the oxidation of the surface of the intermediate layer. Excessive oxidation of the surface should be avoided, because an oxidation of, for example, a titanium carbide surface involves a volume expansion and a change in structure which might lead to a loss of adhesion.

The thickness of the aluminum oxide layer is normally from 0.1 to 20, often 0.2 to 10, preferably 0.3 to 3, and most preferably 0.5 to 2, μm. The thickness of the intermediate layer or of successive layers—lying on the top as well as lying below the alumina coating—is normally of the same size, i.e., 0.1-20 μm. In the case that intermediate layers of wear resistant carbides, nitrides, carbonitrides and/or borides are being used, the thickness is normally from 1 to 8, preferably from 1.5 to 7, μm.

For the deposition of the kappa aluminum oxide coating the known system involving the hydrogen reduction of an aluminum halide, preferably the chloride ($AlCl_3$), and the reaction with water vapor or oxygen can be used. The aluminum halide may be produced in the gas form either by evaporation of the solid or liquid form or by the reaction of aluminum metal with chlorine or hydrogen chloride. The water vapor may be produced in the gas form by evaporation or, preferably, by the reaction between hydrogen and carbon dioxide. Titanium tetrachloride ($TiCl_4$) for doping of the aluminum oxide is produced in the vapor form by evaporation of the liquid. If other halides of titanium, zirconium or hafnium are used, the vapor may be produced in a similar manner. The reactants are passed into the reaction chamber in which the sintered cemented carbide specimens to be coated are situated. The specimens may either be heated directly by inductive heating or indirectly by heating a supporting plate or the reactor with, for example, electrical resistance heating. The deposition temperature may be in the range of from about 700° C. to 1200°, preferably from about 950° C. to 115° C., the actual temperature being dependent on the type of impurities present or dopants used.

The aluminum chloride and water vapor (or carbon dioxide or oxygen) concentrations in the reactant gas mixture should preferably be approximately stoichiometric. In the case of chemical vapor deposition, the concentration of the tetravalent halide(s) should be in the range of from 0.03 to 0.5%, preferably less than 0.2%, of the total amount of gas supplied to the reactor. If the deposition is performed by means of some method other than that of chemical vapor deposition, a corresponding amount of halide(s) should be used. Also, it is important that the concentrations of $CO_2$ and $H_2$ be carefully controlled. The recommended amounts of tetravalent halides apply to approximately stoichiometric proportions of carbon dioxide and aluminum chloride. In the case of more reducing conditions in the reactor, the lower ratios of carbon dioxide-to-hydrogen or water vapor-to-hydrogen will require that a larger amount of tetravalent halides are added. The particular amount necessary in such a case can be readily determined by one skilled in the art in accordance with the teachings of the present invention. The overall pressure of the gas phase may be in the range of 1 to 760 Torr, but preferably 30 to 80 Torr. If the deposition is not carefully controlled in accordance with the conditions given above, alpha or other undesirable aluminum oxide phases will be formed in considerably amounts.

It has also been found that the addition of titanium and/or zirconium and/or hafnium dopants as described above increases the deposition rate of the aluminum oxide. As an example of results obtained, there is illustrated in FIG. 2 a diagram showing the rate of growth as a function of the amount of added titanium tetrachloride (in % by volume). From the diagram can be calculated that for example an addition of about 0.05% titanium tetrachloride has given a 3-fold increase of the growth rate (from 0.1 μm/h to about 0.3 μm/h).

The coating of kappa aluminum oxide normally contains a certain amount of titanium, hafnium and/or zirconium, in the oxide layer in the form of, for example, the dioxide of titanium, hafnium or zirconium, respectively. The addition of Ti, Hf and/or Zr during the aluminum oxide coating has influenced the formation of the oxide. In those cases where, for example, titanium dioxide is a part of the layer, the amount is usually 0.5-10%.

The invention is additionally illustrated in connection with the following Examples which illustrate different conditions being used for making surface coated cemented carbide bodies according to the invention as well as results reached in testing such bodies. It should be understood, however, that the invention is not limited to the specific details of the Examples.

EXAMPLE 1

A number of sintered cemented carbide cutting inserts of the ISO grade M20 were coated with a 6 μm thick layer of titanium carbide and then consecutively coated with a 1 μm thick layer of kappa aluminum oxide.

The kappa aluminum oxide deposition conditions were as follows:

| | | |
|---|---|---|
| reactant gas mixture | $H_2$ | 90% |
| | $AlCl_3$ | 2% |
| | $CO_2$ | 6% |
| | $TiCl_4$ | 0.1% |
| | CO | 1.9% |
| rate of gas flow | | 2 m/s |
| pressure of the gas mixture | | 50 Torr (6.7 kPa) |
| temperature | | 1010° C. (1283 K.) |
| deposition time | | 1.5 hr. |

The kappa aluminum oxide coating was fully dense, polycrystalline and well adherent.

In a test of the performance of inserts coated according to the present invention an increase in the life of the insert by up to 20% was obtained when compared to the life of inserts coated according to prior used methods, which do not involve the addition of tetravalent halides.

EXAMPLE 2

A number of cemented carbide cutting inserts were coated similarly to Example 1 with the exception that the coating consisted of an intermediate layer of 3 μm titanium carbide and an outer layer of 3 μm aluminum oxide. The deposition time for the aluminum oxide was increased to 5 hours, while the time for the carbide deposition was halved, the deposition conditions being the same as in Example 1.

The outer coating consisted of kappa-phase aluminum oxide to an extent of 99%, the remainder being alpha aluminum oxide in the form of round areas with a diameter not exceeding 5 μm.

In a comparison test of the performance of these coatings in the same manner as that of Example 1, an increase in the life of the inserts by as much as 100% was found.

EXAMPLE 3

A number of cemented carbide inserts of the ISO grade M20 were coated with kappa aluminum oxide directly on the substrate of cemented carbide. The same conditions as in Example 1 were used for the oxide coating. Also in this case in increase in the life of the inserts by up to about 20% was obtained compared to inserts coated with aluminum oxide by prior known technique. The tests were performed by the turning of steel having a carbon content of about 1%.

EXAMPLE 4

Sintered cemented carbide bodies were coated with an intermediate layer of 2 μm hafnium nitride and a surface layer of 1 μm kappa aluminum oxide. The two layers were applied by CVD deposition, the intermediate layer being applied according to normal practice, while the surface layer was applied according to the following process conditions:

| | | |
|---|---|---|
| reactant gas mixture | $H_2$ | 89% |
| | $AlCl_3$ | 2% |
| | $CO_2$ | 7% |
| | $ZrCl_4$ | 0.05% |
| | CO | 1.95% |
| rate of gas flow | | 2.5 m/s |
| pressure of the gas mixture | | 55 Torr |
| temperature | | 1015° C. |
| deposition time | | 1 hr. |

As result, a layer of well adherent aluminum oxide was obtained, consisting of at least 90% kappa phase.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. Sintered cemented carbide body containing at least one metal carbide and a binder metal, on which body there is applied at least one thin, wear resistant surface layer consisting essentially of aluminum oxide, characterized in that at least 85% of the aluminum oxide consists of the kappa form, the remainder if any, which mainly constitutes the alpha form, being formed as surface portions or spots having a size of at the most 10 μm[, the size and the occurrence of the surface portions being so adjusted that they lie within the area AOB in FIG. 1 of the attached drawing].

2. The sintered cemented carbide body of claim 1, wherein the alpha form of the aluminum oxide falls within the area A'OB' in FIG. 1.

3. Cemented carbide body according to claim 1, characterized in that the thickness of the aluminum oxide layer is from 0.1 to 20 μm.

4. The cemented carbide body of claim 1, wherein the aluminum oxide layer has a thickness of from 0.3 to 3 μm.

5. Cemented carbide body according to claim 1 or 3, characterized in that a thin intermediate layer of wear resistant carbide, nitride, carbonitride and/or boride, of one or more of the elements Ti, Zr, Hf, V, Nb, Ta, Cr, Mo, W, Si and/or B, is applied between the aluminum oxide layer and the cemented carbide body.

6. Cemented carbide body according to claim 5, characterized in that the thickness of the intermediate layer is from 1 to 7 μm.

7. Cemented carbide body according to claim 6, characterized in that the thickness of the intermediate layer is from 1.5 to 8 μm.

8. Cemented carbide body according to claim 6, characterized in that the intermediate layer consists of the carbide, nitride and/or carbonitride of titanium.

9. Cemented carbide body according to claim 1, characterized in that the aluminum oxide layer contains minor amounts of titanium, zirconium and/or hafnium.

10. A method of making an aluminum-oxide coated cemented carbide body wherein a cemented carbide substrate is contacted with a gas containing an aluminum halide and a reducing agent at high temperature, characterized in that a dopant addition of tetravalent titanium, zirconium and/or hafnium ions is added to the gas in an amount of 0.03–0.5% of the totally supplied amount of gas whereby the cemented carbide substrate is coated with aluminum oxide, at least 85% of which is in the kappa form.

*11. The sintered cemented carbide body of claim 1 wherein the alpha form of the aluminum oxide falls within the area AOB in FIG. 1.*

*12. The cemented carbide body of claim 1 comprising at least one intermediate layer between the aluminum oxide layer and the cemented carbide body.*

*13. The cemented carbide body of claim 12 wherein said at least one intermediate layer comprises a wear resistant carbide, nitride, carbonitride and/or boride of one or more of the metals Ti, Zr, Hf, V, Nb, Ta, Cr, Mo, W, Si and/or B.*

*14. The cemented carbide body of claim 13 wherein said at least one intermediate layer comprises TiC.*

*15. The cemented carbide body of claim 12 wherein said at least one intermediate layer has a thickness of from 1 to 8 μm.*

*16. The cemented carbide body of claim 12 wherein said at least one intermediate layer has a thickness of from 1.5 to 7 μm.*

*17. The cemented carbide body of claim 12 comprising several successive intermediate layers between the aluminum oxide layer and the cemented carbide body.*

*18. The cemented carbide body of claim 5 wherein said intermediate layer comprises TiC.*

*19. The method of claim 10 wherein the thickness of said aluminum oxide layer ranges from 0.1 to 20 μm.*

*20. The method of claim 19 wherein the thickness of said aluminum oxide layer ranges from 0.3 to 3 μm.*

*21. The method of claim 10 wherein at least one intermediate layer of a wear resistant carbide, nitride, carbonitride and/or boride is applied between the cemented carbide body and said aluminum oxide.*

*22. The method of claim 21 wherein said at least one intermediate layer comprises a wear resistant carbide, nitride, carbonitride and/or boride of one or more of the metals Ti, Zr, Hf, V, Nb, Ta, Cr, Mo, W, Si and/or B.*

*23. The method of claim 22 wherein said at least one intermediate layer comprises TiC.*

*24. The method of claim 21 wherein said at least one intermediate layer has a thickness of from 1 to 8 μm.*

*25. The method of claim 21 wherein said at least one intermediate layer has a thickness of from 1.5 to 7 μm.*

*26. The method of claim 21 herein several successive intermediate layers are applied between the aluminum oxide and the cemented carbide body.*

*27. The method of claim 10 wherein an intermediate layer of a wear resistant carbide, nitride, carbonitride and/or boride of one or more of the metals Ti, Zr, Hf, V, Nb, Ta, Cr, Mo, W, Si and/or B is applied between the cemented carbide body and said aluminum oxide.*

*28. The method of claim 27 wherein said intermediate layer comprises TiC.*

* * * * *